United States Patent [19]

Héraud et al.

[11] Patent Number: 5,071,679
[45] Date of Patent: Dec. 10, 1991

[54] PROCESS FOR PRODUCING COMPOSITE MATERIALS WITH REINFORCEMENT IN SILICIUM CARBIDE FIBERS AND CERAMIC MATRIX

[75] Inventors: Louis Héraud; Joëlle Lalande, both of Bordeaux, France

[73] Assignee: Societe Europeenne de Propulsion, Suresnes, France

[21] Appl. No.: 360,943

[22] Filed: Apr. 27, 1989

[30] Foreign Application Priority Data

May 10, 1988 [FR] France .................. 88 06307

[51] Int. Cl.$^5$ .................. B05D 1/36; C04B 35/52
[52] U.S. Cl. .................. 427/264; 427/204; 427/309; 501/35; 501/90
[58] Field of Search .................. 427/204, 264, 309; 501/35, 90

[56] References Cited

U.S. PATENT DOCUMENTS

| | | | |
|---|---|---|---|
| 4,022,585 | 5/1977 | Kaye .................. | 428/551 |
| 4,065,592 | 12/1977 | Von McAllister .................. | 428/92 |
| 4,429,322 | 1/1984 | Dressler et al. .................. | 346/140 R |
| 4,935,214 | 6/1990 | Pugar et al. .................. | 423/324 |

Primary Examiner—Peter A. Nelson
Attorney, Agent, or Firm—Bacon & Thomas

[57] ABSTRACT

The process comprises the steps of forming a fibrous reinforcement with silicium carbide fibers, forming on the fibers an intermediate coating designed to constitute an interface between the fibers and a matrix, and forming a matrix in ceramic material within the residual porosity of the fibrous reinforcement. In a step prior to the formation of the intermediate coating, a treatment is carried out by the chemical route for the elimination of the silica present on the surface of the silicium carbide fibers.

6 Claims, 1 Drawing Sheet

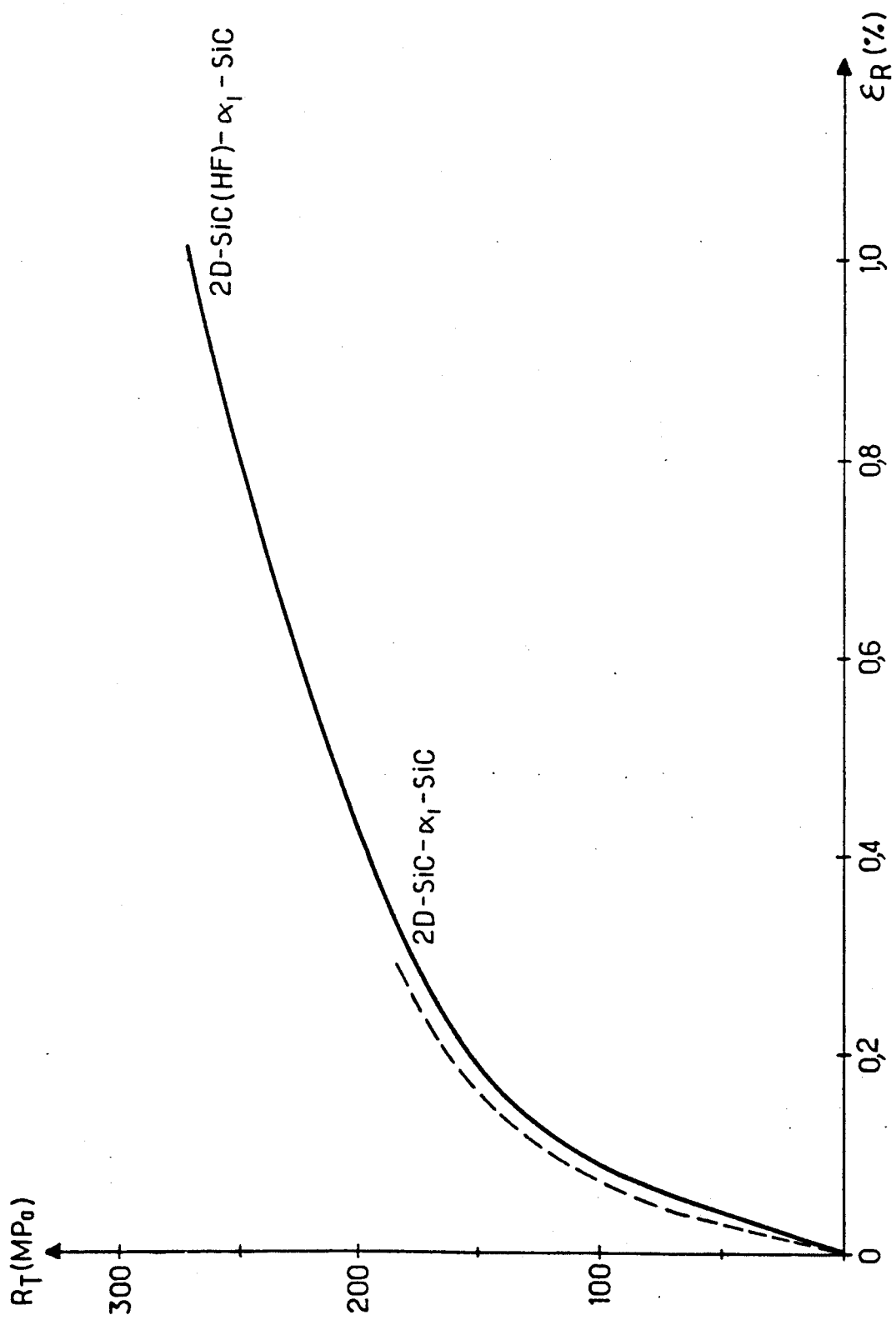

PROCESS FOR PRODUCING COMPOSITE MATERIALS WITH REINFORCEMENT IN SILICIUM CARBIDE FIBERS AND CERAMIC MATRIX

FIELD OF THE INVENTION

The present invention relates to a process for producing composite materials with reinforcement in silicium carbide (Sic) fibers and a ceramic matrix.

BACKGROUND OF THE INVENTION

Carbon-carbon type composite materials (with carbon fiber reinforcement and carbon matrix) have proved to react well to various applications involving high thermomechanical stresses, such as in tuyere elements for rocket motors, aircraft brake discs, etc.

In an attempt to further improve the properties of composite materials, particularly at high temperature, ceramic materials have been used for the fibrous reinforcement and for the matrix, instead of carbon which has been found to have a limited mechanical resistance and an inadequate resistance to oxidation when exposed for prolonged periods in an oxidizing medium at high temperature.

It is generally well-known that in composite materials with fibrous reinforcement, the properties of the fibers-matrix interface have a great influence on the mechanical properties of the material.

In the case of composite materials with ceramic matrix, it has been found that a satisfactory behavior could be obtained, particularly as regards shocks and crack propagation, and in spite of the ceramic nature of the matrix, by forming on the fibers a thin intermediate coating of for example pyrolytic carbon deposited by chemical vapor deposition, or of boron nitride, before the infiltration of the ceramic material of the matrix.

OBJECT OF THE INVENTION

It is the object of the present invention to provide a process which further improves the mechanical properties of the composite materials with SiC fibers reinforcement and ceramic matrix.

This object is reached according to the invention, with a process of the type comprising the steps of forming a fibrous reinforcement composed of silicium carbide fibers, forming on said fibers an intermediate coating designed to constitute an interface between the fibers and a matrix, and forming a matrix in ceramic material within the residual porosity of the fibrous reinforcement, process wherein, according to the invention, in a step prior to forming the intermediate coating, a treatment is applied which consists in eliminating by the chemical route, the silica present on the surface of the silicium carbide fibers.

The fibrous reinforcement is preferably treated with hydrofluoric acid (HF) in solution in water, but other treatments are also suitable, such as for example those using:

a solution of nitric acid in water ($HNO_3 + H_2$), under heat, or a mixture of hydrofluoric, nitric and acetic acids in the following proportions: (HF 3 ml + $HNO_3$ 5 ml + $CH_3$—$CO_2H$ 3 ml), under heat, or a mixture of ammonium fluoride and of hydrofluoric acid ($NH_4F + HF$), in solution in water, or a mixture of nitric acid and of potassium fluoride ($HNO_3 + KF$).

The above treatments for the chemical elimination of silica are well-known, but the application made thereof according to the invention leads to an unexpected improvement of the mechanical properties of the composite materials produced from the fibrous reinforcements thus treated. Indeed, gains which can reach up to more than 40% in tensile strength at room temperature and more than 300% in breaking elongation, have been recorded.

The improvement of the mechanical properties of the material is therefore considerable and leads one to think that the silica present on the surface of the fibers must, despite its small thickness, (a few tenths of microns), have had a very unfavorable effect on the quality of the fibers-matrix interface, a fact which had never been brought out before.

When the SiC fibers are coated with a size which cannot be eliminated by the treatment used for eliminating the silica, said size is preferably eliminated before carrying out said treatment.

DESCRIPTION OF THE INVENTION

The invention will be more readily understood on reading the following description given by way of example and non-restrictively with reference to the accompanying drawing, in which the only FIGURE shows two curves illustrating the relation between stress and deformation observed during tensile tests conducted on composite materials comprising fibrous reinforcements which have been, respectively, treated according to the invention and non-treated according to the invention.

The process according to the invention was carried out on fibrous textures, and more particularly fabrics formed of SiC fibers produced by the Japanese company NIPPON CARBON CO. Ltd. by using a treatment for elimination of the silica by a solution of hydrofluoric acid in water.

Although hydrofluoric acid causes partial dissolving of an epoxy-based size, said acid has no effect on a vinylacetate size with which some of the aforesaid fibers may also be coated. Therefore, in this last case, in order for the subsequent treatment with an hydrofluoric acid solution to be absolutely efficient, it is advised to eliminate beforehand the vinylacetate size. Accordingly, the SiC fibers or fibrous textures formed therewith, can undergo a thermal unsizing treatment (said technique being more efficient than a chemical unsizing, which can also be used). The SiC fibers or the textures are for example heated to a temperature of 600° C. in the air for 20 seconds. The use of a relatively moderate temperature for a very short period of time prevents a noticeable oxidation of the silicium carbide.

Elimination by hydrofluoric acid of the silica present on the surface of the SiC fibers is carried out before or after the production of a preform from said textures. Therefore, in the case of fibrous textures constituted by fabrics destined to be used as reinforcements or preforms by stacking a plurality of layers of fabric optionally bonded together, for example by implantation of transversal yarns, the treatment according to the invention can be carried out on the fabric before or after the stacking of the layers of fabric.

In the cited examples, after unsizing, the elimination of the silica present on the SiC fibers is performed by immersing the fibrous textures in a solution of hydrofluoric acid in water at a concentration varying between about 20 and 30 mol %, for about one hour, then by rinsing the textures in water and drying them.

Analyses carried out on the textures in SiC fibers treated as indicated above, have revealed, after treatment, a near-total disappearance of the silica initially present on the surface of the fibers. Although the non-treated fibers have a silica coating of variable thickness, in average equal to about 0.3 μm, said thickness is reduced to about 0.005 μm after treatment by the solution of hydrofluoric acid.

EXAMPLE 1

Fabrics in SiC fibers "Nicalon" produced by the Japanese company NIPPON CARBON Co. Ltd. were used, on the one hand, without the treatment by a solution of hydrofluoric acid, and on the other hand, after the treatment, as indicated hereinabove, by a solution of hydrofluoric acid (treatment preceded by unsizing), for preparing test pieces in composite material by the following method:

preparation of a fiber-reinforced preform by stacking a plurality of layers of fabric (stacking produced after the treatment by the hydrofluoric acid solution in the case of treated fabrics), formation on the fibers of the preform of an intermediate coating in pyrolytic carbon by chemical vapor deposition, until a coating thickness of about 0.3 μm is reached, and formation of a silicium carbide matrix by chemical vapor infiltration until a residual porosity of about 10 volume % is reached.

The intermediate coating process with pyrolytic carbon is of the type described in the aforesaid United States Patent. As to the chemical vapor infiltration of the silicium carbide, this is performed as described in French Patent No. 77 26 979 (Publication No. 2 401 888).

Tensile tests were conducted in parallel to the layers of fabric and in parallel to one of the two directions of the fibers, at room temperature on the obtained test pieces in composite material. The FIGURE shows the relation between the pulling force exerted ($R_T$) and the breaking elongation ($\epsilon_R$) measured, for the material obtained after treatment of the fibrous texture according to the invention (curve A) and without treatment of the fibrous texture (curve B). It is found that the treatment according to the invention leads to an increase of the tensile strength from about 185 MPa to about 275 MPa (i.e. a 48% increase) and an increase of the breaking elongation from about 0.3% to about 1% (i.e. an increase of more than 300%).

It will be noted that the increase in breaking elongation brought by the treatment according to the invention guarantees, in the overstressed zone of the obtained pieces in composite material, a margin of safety similar to that brought by the plasticizing of metallic materials.

The elastic modulus is the same for the two materials until breaking of the material to which curve B corresponds.

EXAMPLE 2

The following examples relate to composite materials which use a reinforcement having the same weaving as used in the preceding example, but which are produced from SiC fibers of "CERAMIC GRADE" type produced by the company NIPPON CARBON Co. Ltd, of a different quality than the fibers used in Example 1 ("REGULAR GRADE").

After the production of composites in the same conditions as in Example 1, the tensile tests have given the following results: a breaking strength equal to 180 MPa, with a breaking elongation equal to 0.2%, and an elastic modulus initially equal to 260 GPa, when using a reinforcement non-treated according to the invention; and a breaking strength equal to 240 MPa with a breaking elongation equal to 0.42%, and an elastic modulus initially equal to 250 GPa, when using a reinforcement treated according to the invention. It is also noted in this example a great improvement of the strength and of the elongation (+33% and +110%, respectively), as well as an elastic modulus keeping to virtually the same value.

EXAMPLE 3

The same type of reinforcement as in the preceding example, treated or non-treated according to the invention, was coated by chemical vapor deposition, with a layer of pyrolytic carbon of 0.3 μm thickness before being impregnated with a resin giving a low rate of carbon-containing residual by thermolysis. The impregnated reinforcement was molded by thermocompression in order to produce shaped pieces. Said pieces were placed in holding installations and infiltrated with silicium carbide by chemical vapor infiltration until their residual porosity reaches close to 10 volume %, the resin being thermolysed under the effect of the temperature rise prior to the infiltration of silicon carbide.

Tests bars taken from the aforesaid pieces were subjected to tests under tensile force, being force and resistance to mechanical shocks. The results of such tests are compiled in the table given at the end of the description, said results confirming those of the preceding examples although they relate to composite materials obtained by a different process.

Although according to the foregoing examples, the ceramic matrix was formed by chemical vapor infiltration of the matrix material, other methods could be used for forming the matrix within the residual porosity of the fibrous reinforcement, such as for example the impregnation of the fibrous reinforcement, optionally coated with an intermediate layer, with a liquid precursor of the ceramic material of the matrix, followed by a thermolysis to obtain said material.

|  |  | Reinforcement non-treated according to the invention | Reinforcement treated according to the invention |
|---|---|---|---|
| Tensile Tests | Breaking Strength | 180 MPa | 220 MPa |
|  | Breaking Elongation | 0.22% | 0.53% |
|  | Initial Elastic Modulus | 220 GPa | 190 GPa |
| Bending Tests | Breaking Strength | 345 MPa | 425 MPa |
| Tests of Resistance to mechanical shocks | Energy at break | 17 kgJ/m2 | 22.5 kgJ/m2 |

We claim:

1. A process for manufacturing a composite material having a fibrous reinforcement densified with a ceramic matrix, comprising the steps of:
   a) forming said fibrous reinforcement from silicon carbide fibers;
   b) subjecting said silicon carbide fibers to a chemical treatment for substantially eliminating silica present at the surface of the fibers;
   c) forming on the fibers, after said chemical treatment, an intermediate coating to constitute an interphase between the fibers and the matrix; and,
   d) subsequently forming a matrix in ceramic material within the residual porosity of the fibrous reinforcement.

2. A process as claimed in claim 1, wherein said fibrous reinforcement is formed from silicon carbide fibers coated with a sizing agent which cannot be eliminated by said chemical treatment, comprising the additional step of substantially completely eliminating said sizing agent prior to said chemical treatment.

3. A process as claimed in claim 1, wherein said chemical treatment is carried out on the silicon carbide fibers prior to the forming of the fibrous reinforcement.

4. A process as claimed in claim 1, wherein the fibrous reinforcement is formed of a plurality of layers of fabric of silicon carbide fibers and said chemical treatment is carried out on said fabric prior to the forming of the fibrous reinforcement.

5. A process as claimed in claim 1, wherein said chemical treatment is carried out after forming of the fibrous reinforcement.

6. A process as claimed in claim 1, wherein said chemical treatment is performed by immersing the silicon carbide fibers in a solution containing hydrofluoric acid.

* * * * *